United States Patent
Lee et al.

(10) Patent No.: US 6,366,322 B1
(45) Date of Patent: Apr. 2, 2002

(54) HORIZONTAL CHARGE COUPLED DEVICE OF CCD IMAGE SENSOR

(75) Inventors: Seo Kyu Lee; Yong Park, both of Kyungki-do (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/102,551

(22) Filed: Jun. 22, 1998

Related U.S. Application Data

(63) Continuation-in-part of application No. 08/637,596, filed on Apr. 25, 1996, now abandoned, which is a continuation of application No. 08/197,114, filed on Feb. 16, 1994, now abandoned, which is a continuation-in-part of application No. 07/818,179, filed on Jan. 8, 1992, now abandoned.

(30) Foreign Application Priority Data

Apr. 15, 1991 (KR) ................................. 91/6020

(51) Int. Cl.[7] .............................................. H04N 5/335
(52) U.S. Cl. ........................................ 348/314; 348/243
(58) Field of Search ................................ 348/294, 311, 348/313, 314, 315, 320, 322, 324, 241, 243; 257/232, 246, 248; H04N 5/335

(56) References Cited

U.S. PATENT DOCUMENTS

| | | | |
|---|---|---|---|
| 4,093,872 A | | 6/1978 | Hartman et al. |
| 4,482,909 A | | 11/1984 | Heald |
| 4,528,596 A | | 7/1985 | Cope |
| 4,605,862 A | | 8/1986 | Takeshita |
| 4,620,231 A | | 10/1986 | Kosonocky |
| 4,675,549 A | | 6/1987 | Steffe et al. |
| 4,859,624 A | * | 8/1989 | Goto .......................... 438/145 |
| 4,987,466 A | | 1/1991 | Shibata et al. |
| 5,091,922 A | | 2/1992 | Uehira |
| 5,249,055 A | * | 9/1993 | Masuda et al. ............. 348/311 |
| 6,243,135 B1 | * | 6/2001 | Nakashiba .................. 348/314 |

* cited by examiner

Primary Examiner—Tuan Ho
(74) Attorney, Agent, or Firm—Morgan, Lewis & Bockius LLP

(57) ABSTRACT

The present invention relates to a HCCD of a CCD image sensor comprising a channel stop region, a BCCD channel formed on the channel stop region, a plurality of first poly gates and a plurality of second poly gates formed on the BCCD channel and alternately arranged in a partially overlapping manner, and a dummy gate formed on the BCCD channel between first and second selected ones of the second poly gates.

13 Claims, 5 Drawing Sheets

HORIZONTAL CHARGE COUPLED DEVICE OF CCD IMAGE SENSOR

This is a continuation-in-part of application Ser. No. 08/637,596 filed on Apr. 25, 1996 now abandoned; which is a continuation of application Ser. No. 08/197,114, filed Feb. 16, 1994, abandoned; which is a continuation-in-part of application Ser. No. 07/818,179 filed on Jan. 8, 1992, abandoned.

BACKGROUND OF THE INVENTION

1. Field of the Invention

The present invention relates to a charge coupled device (CCD) image sensor, and more particularly to a horizontal charge coupled device (HCCD) having a dummy gate, which causes noise signals to flow from the noise transfer region to ground. The dark current, therefore, flows in the opposite direction of the actual signals, thereby decreasing the effect of the dark current.

2. Discussion of the Related Art

Generally, a CCD image sensor comprises a plurality of photodetectors for generating signal charges in accordance with the intensity of the incident light, a plurality of vertical charge coupled devices (VCCDs) for vertically transferring signal charges from photodetectors and a HCCD for horizontally transferring signal charges from BCCDs.

FIG. 1 shows a structure of a HCCD according to the conventional art and FIGS. 2A and 2D are potential distribution diagrams taken along line II-II' of FIG. 1. As shown in FIG. 1, first and second poly gates 1 and 2 are alternatively and successively formed on the BCCD channel 5, which are overlapping each other. The channel stop region 7 is electrically connected to ground (i.e., grounded) to have a higher potential. The potential level of the BCCD channel 5 is changed in accordance with the bias applied to the poly gates.

In FIG. 2A, the symbol "+++" marked below the second poly gate 2 stands for the impurity regions which have a lower impurity concentration than the BCCD channel 5 in order to form a staircase potential barrier. In a HCCD of the aforesaid structure, the channel stop region 7 is always grounded so that the potential level is higher than that of the BCCD channel 5, as shown in FIG. 2B. If the clock signals H$\phi$1 and H$\phi$2 are applied to poly gates 1 and 2, the noise charges (e') generated in the channel stop region 7 and p-type well (not shown) with the signal charges (e) transferred from BCCDs are transferred into the BCCD channel 5 as shown in FIGS. 2C and 2D. Therefore, the dark current generated in the sensing amplifier 8 is increased.

SUMMARY OF THE INVENTION

It is an object of the present invention to provide a HCCD of a CCD image sensor in which a dummy gate and a dummy drain are respectively formed above and within a BCCD channel to cause the actual signals to flow in the opposite direction of the dark current.

To obtain the above object, there is provided a HCCD of a CCD image sensor which includes a plurality of photodetectors for generating signal charges in accordance with the density of the incident light, a plurality of VCCDs for vertically transferring signal charges from photodetectors comprising a BCCD channel having a signal charge transfer region for horizontally transferring signal charges from VCCDs, and a noise charge transfer region for transferring noise charges which are generated therein in the opposite direction of the signal charge transfer region. The signal charge transfer region and noise charge transfer region have a plurality of impurity regions.

A first plurality of poly gates are formed above the signal charge transfer region of the BCCD channel. The first plurality of poly gates further has a plurality of first poly gates and a plurality of a second poly gates. The first poly gates and second poly gates are alternately and successively arranged. A dummy gate is then formed at the introduction portion of the noise charge transfer region of the BCCD channel. A second plurality of poly gates are formed at the noise charge transfer region of the BCCD channel. The second plurality of poly gates further has a plurality of first poly gates and a plurality of second poly gates which are symmetrically arranged with the first plurality of poly gates and separated from the first plurality of poly gates by the dummy gate. A dummy drain for draining the noise charges from the noise charge transfer region is formed at the end portion of the noise charge transfer region of the BCCD channel.

The features and advantages of the present invention will be more clearly appreciated from the following description of the preferred embodiments of the invention in conjunction with the accompanying drawings.

DETAILED DESCRIPTION OF THE PREFERRED EMBODIMENTS

The preferred embodiment of the present invention which obtains the object of providing a HCCD of a CCD image sensor in which a dummy gate and a dummy drain are respectively formed above and within a BCCD channel to cause the actual signals to flow in the opposite direction of the dark currents is described in more detail with reference to the accompanying FIGS. 3, 4, and FIGS. 5A–5D as follows.

Figure 3:
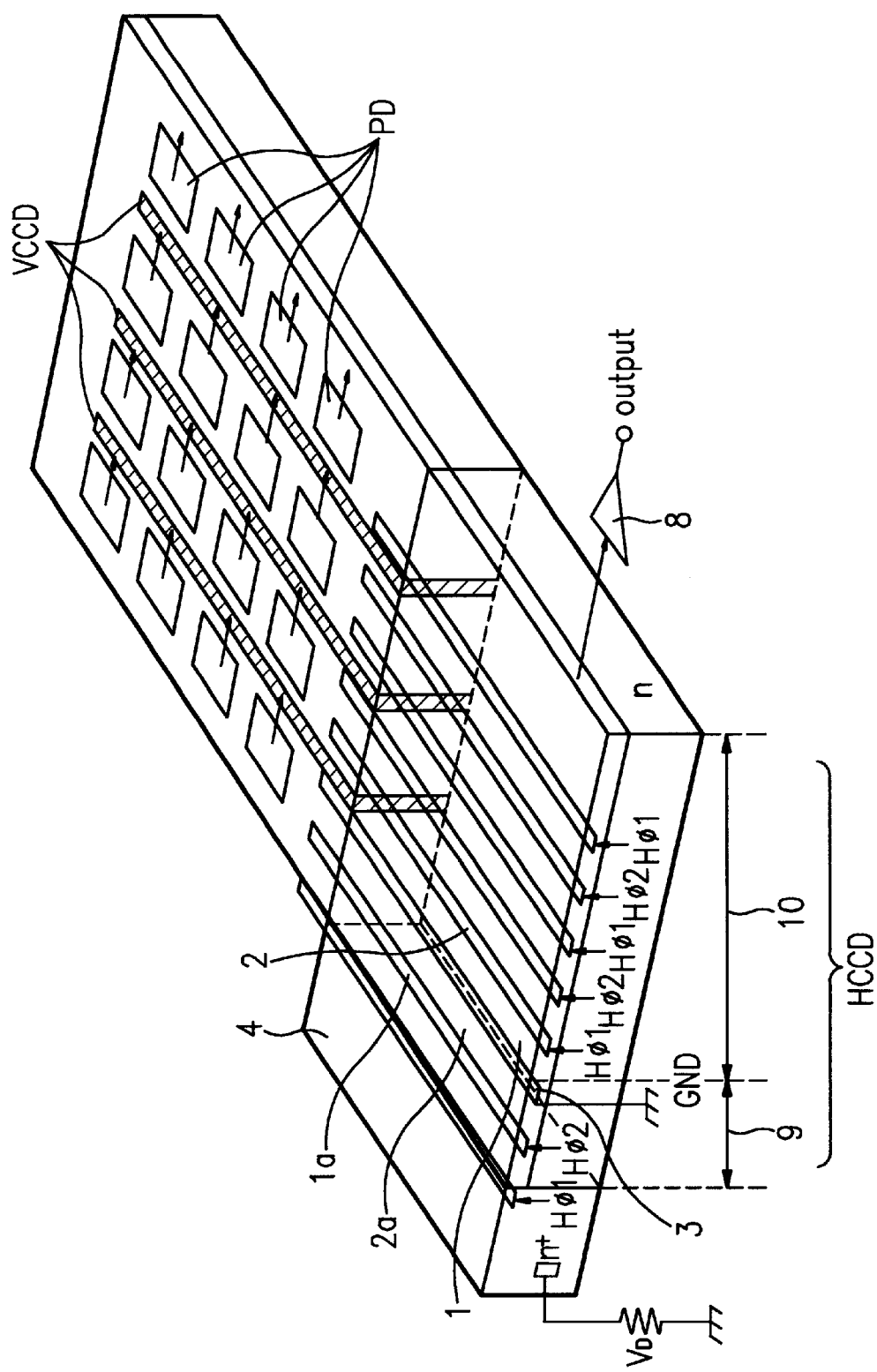
FIG. 3 is a perspective view of a HCCD according to the present invention.
Figure 4:
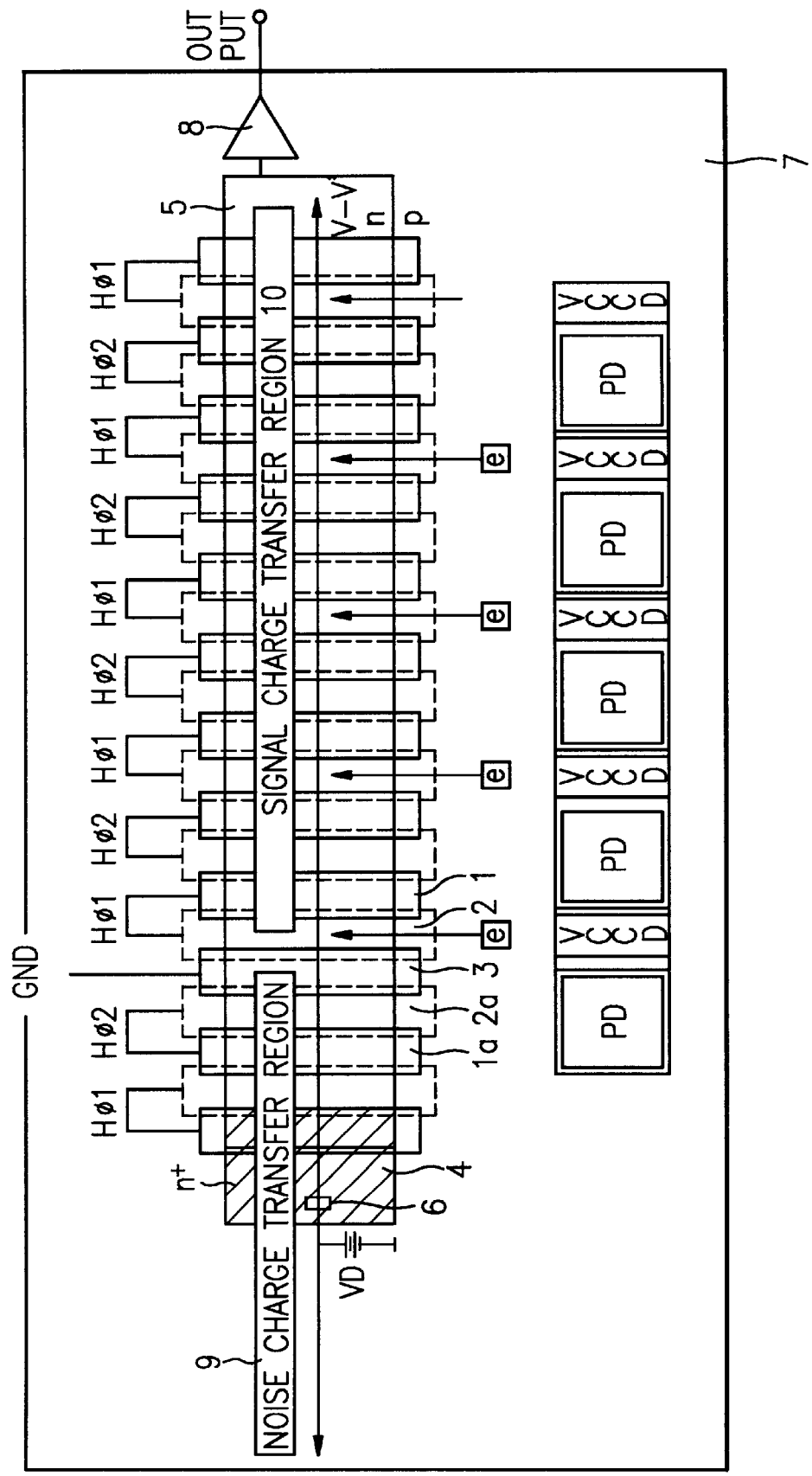
FIG. 4 is a plan view illustrating a structure of a HCCD having a dummy drain and a dummy gate according to the present invention.
Figure 5A:
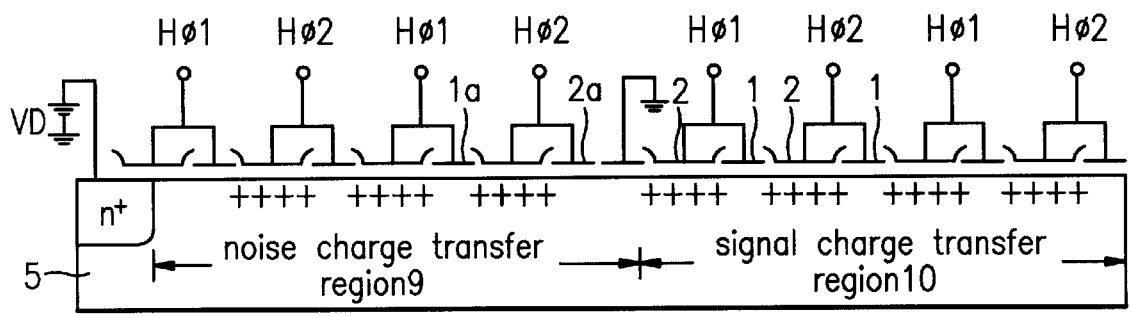
FIG. 5A is a cross-sectional view of a HCCD taken along line of V-V' of FIG. 4.

FIGS. 3 and 4 show a perspective view and a plan view, respectively, illustrating a structure of a HCCD according to the present invention. FIG. 5A shows a cross-sectional view of a HCCD taken along line V-V' of FIG. 4, and FIGS. 5B–5D are potential distribution diagrams taken along line V-V' of FIG. 4 in accordance with clock signals.

FIG. 4 further shows a HCCD comprised of a signal charge transfer region 10 and a noise charge transfer region 9 of a BCCD channel 5. Both the signal charge transfer region 10 and the noise charge transfer region 9 have formed above them of a plurality of first poly gates and a plurality of a second poly gates. Above the noise charge transfer region 9, the first and second poly gates (2a and 1a, respectively) are formed continuously in this order in the left direction of the dummy gate 3. The signal charge transfer region 10 has first and second poly gates (2 and 1, respectively) formed continuously in this order in the right direction of the dummy gate 3. More specifically, FIGS. 3 and 4 shows the first poly gate 2 and the second poly gate 1 are formed on the signal charge transfer region 10 of the BCCD channel 5. The first poly gate 2a and the second poly gate 1a are formed on the noise charge transfer region 9 of the BCCD channel 5. The poly gates 2a and 1a of the noise charge transfer region 9 are alternately successively arranged in the symmetrical direction opposite to the poly gates 2 and 1 of the signal charge transfer region 10. The $n^-$-type layer 4, (or dummy drain 4) which has the contact 6 by which the voltage source $V_D$ may be applied, is formed at the end portion of the noise charge transfer region 9 of the BCCD channel 5.

The dummy gate 3 is formed at the introduction portion of the noise charge transfer region 9 of the BCCD channel 5. The ground voltage or the fixed bias is applied to the dummy gate 3. The dummy gate 3 and the n' type layer 4 drain the noise charges from the noise charge transfer region 9 of the BCCD channel 5 to ground. Accordingly, the present invention includes additional structures such as the dummy gate 3, the noise charge transfer region 9, and the dummy drain 4, which are connected to the signal charge transfer region 10.

Figure 1:
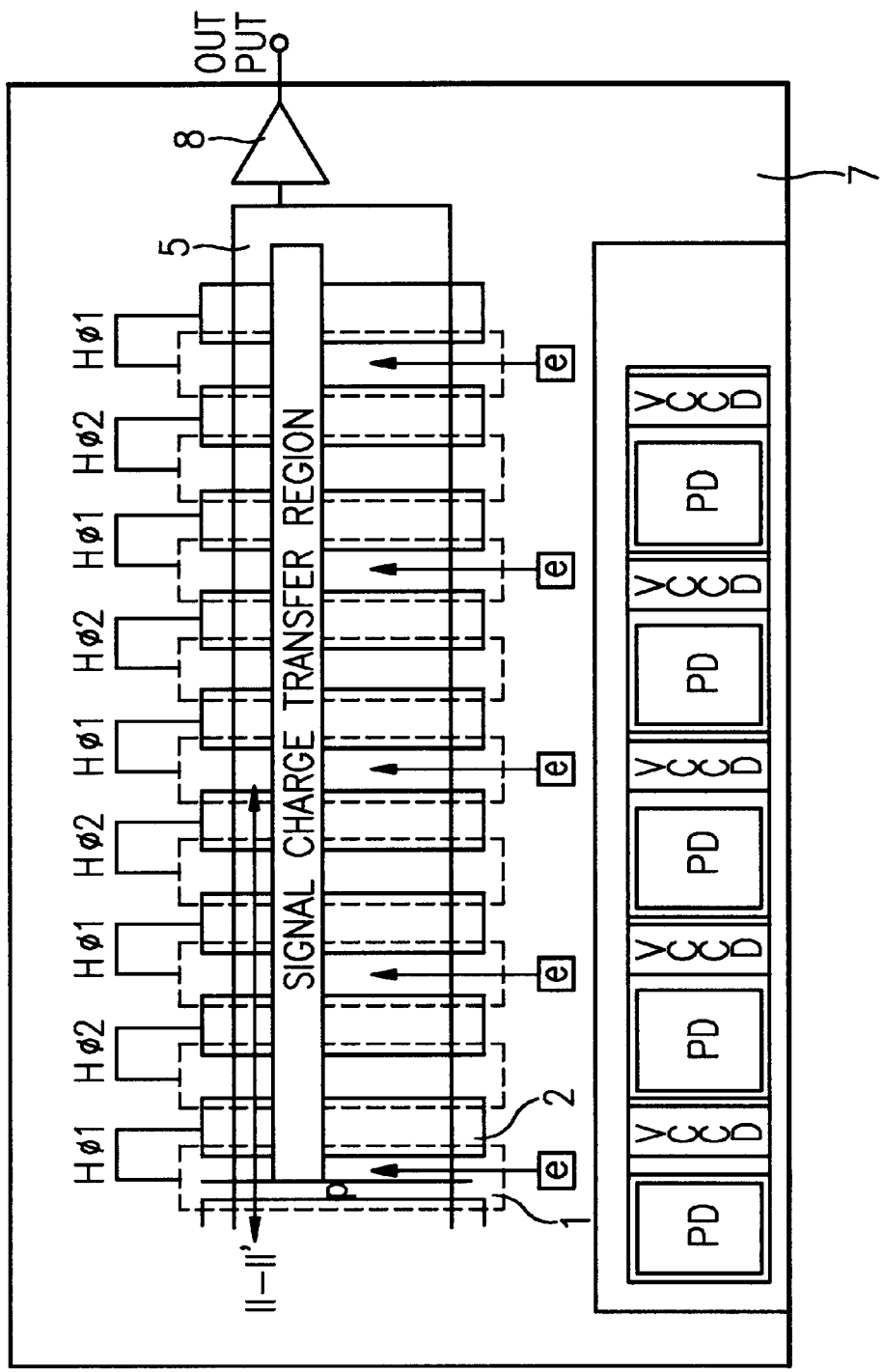
FIG. 1 is a plan view illustrating a structure of a HCCD according to the conventional art.
Figure 2A:
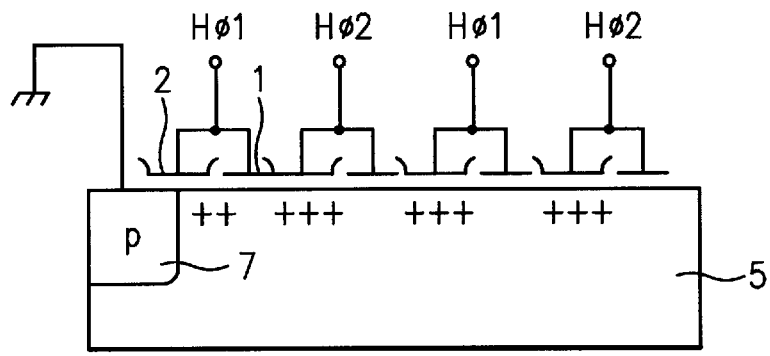
FIG. 2A is a cross-sectional view of a HCCD taken along line II-II' of FIG. 1.
Figure 2B:
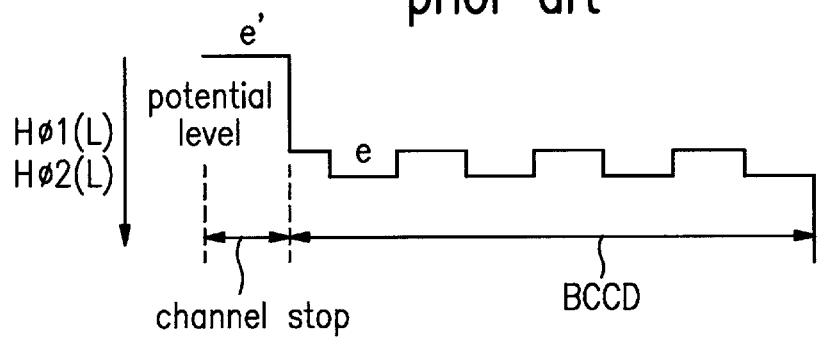
FIGS. 2B to 2D are potential distribution diagrams of FIG. 2A in accordance with clock signals.
Figure 2C:
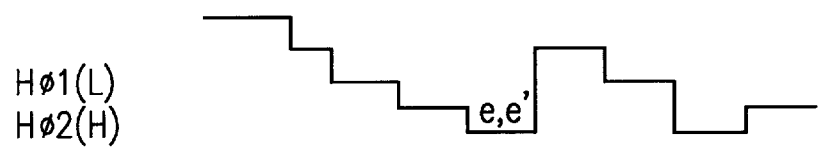
Figure 2D:
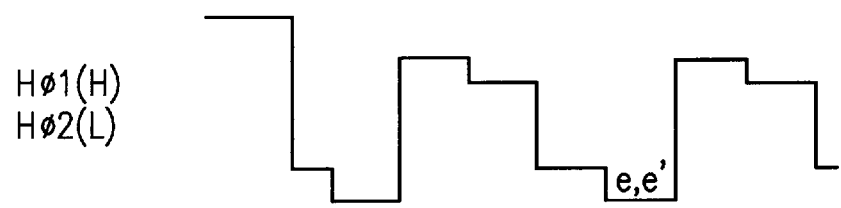

The impurity regions for a staircase potential barrier must be formed under the first poly gates 2 and 2a the same as FIG. 2A, but the symbols "+++" are omitted in FIG. 5A.

Figure 5B:
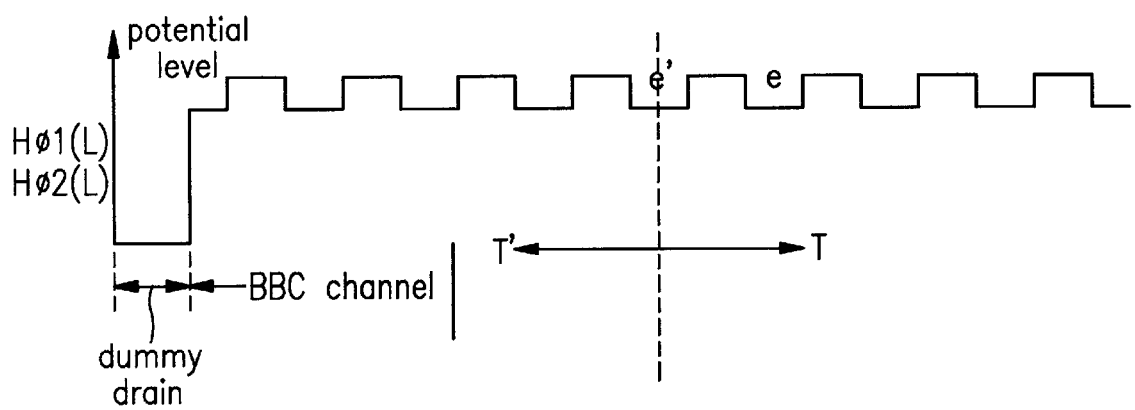
FIGS. 5B to 5D are potential distribution diagrams taken along line V-V' of FIG. 4 in accordance with clock signals.
Figure 5C:
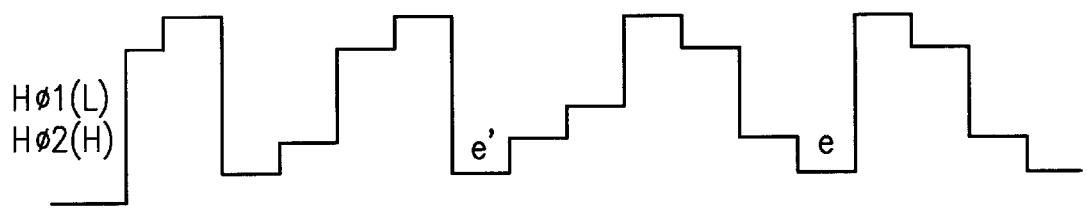
Figure 5D:
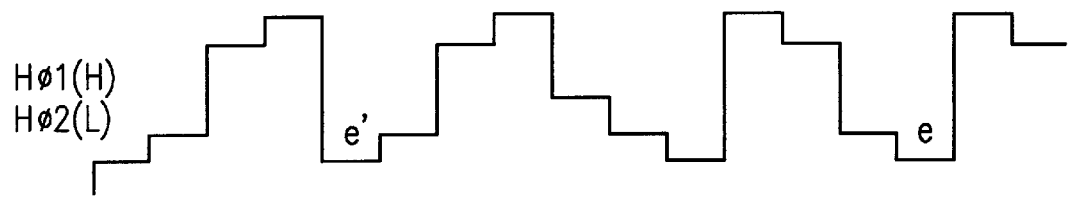

If no bias is applied to poly gates 1 and 2 above the signal charged transfer region 10 and poly gates 1a and 2a above the noise charge transfer region 9, the potential level in the BCCD channel 5 is distributed as shown in FIG. 5B. If the voltage $V_D$ is applied to the $n^-$-type layer 4 through the contact 6 and clock signals H$\phi$1 and H$\phi$2 are applied to the poly gates 1 and 2 above the signal charge transfer region 10 and the poly gates 1a and a above the noise transfer region, the signal charges (e) transferred from VCCDs are transferred in the T direction of FIGS. 5C and 5D.

At this time, because the potential barrier in the signal charge transfer region 10 of the BCCD channel 5 is higher than that in the noise charge transfer region 9, the noise charges (e') which are generated in the starting stage of the BCCD channel 5 are transferred in the T' direction. Thus, whenever the clock signals H$\phi$1 and H$\phi$2 are applied to poly gates 1, 2, 1a, and 2a, the potential level is changed from FIGS. 5C to 5D, or from FIGS. 5D to 5C.

Therefore, the signal charges (e) are transferred in the T direction to the sensing amplifier 8 to output the image signal and the noise charges (e') are transferred in the T' direction to flow into the $n^+$-type layer 4, thereby not affecting the signal charge.

According to the present invention, the dummy drain 4 and dummy gate 3 cause noise signals to flow from the noise charge transfer region to ground. Further, the dummy drain 4 and dummy gate 3 prevent the dark current from flowing into the signal charge transfer region. This enables the reference potential of a BCCD can be precisely maintained by applying the constant voltage $V_D$ to a dummy drain 4, and an amount of the noise charges injected into a dummy drain 4 can be detected by measuring the amount of the current of the voltage source $V_D$.

It will be understood by those skilled in the art that the foregoing description is in terms of a preferred embodiment of the present invention wherein various changes and modifications may be made without departing from the spirit and scope of the invention, as set forth in the appended claims.

What is claimed is:

1. A horizontal charged coupled device (HCCD) comprising:

a channel stop region;

a BCCD channel formed on the channel stop region;

a plurality of first poly gates and a plurality of second poly gates formed on the BCCD channel and alternately arranged in a partially overlapping manner; and a dummy gate formed on the BCCD channel between first and second selected ones of the second poly gates.

2. The HCCD according to claim 1, wherein the dummy gate is partially overlapped by the first and second selected ones of the second poly gates.

3. The HCCD according to claim 1, wherein the dummy gate is connected to ground.

4. The HCCD according to claim 1, further comprising a dummy drain formed on the BCCD channel.

5. The HCCD according to claim 4, wherein the dummy drain is connected to a voltage source.

6. The HCCD according to claim 4, wherein the dummy drain comprises an $n^-$-type layer.

7. A horizontal charged coupled device (HCCD) comprising:

a substrate;

a signal charge transfer region defined in the substrate;

a noise charge transfer region defined in the substrate, the noise charge transfer region being extended in an opposite direction from the signal charge transfer region;

a plurality of first poly gates and a plurality of second poly gates on the signal charge transfer region and alternately arranged;

a first clock signal terminal and a second clock signal terminal, each terminal being connected to both first and second poly gates in an alternate fashion; and a plurality of third poly gates and a plurality of fourth poly gates on the noise charge transfer region and alternately arranged, the second clock signal terminal and the first clock signal terminal each being connected to both the third and the fourth poly gates in an alternate fashion.

8. The HCCD according to claim 7, further comprising a dummy gate on the BCCD channel dividing the signal charge transfer region and the noise charge transfer region.

9. The HCCD according to claim 8, wherein the dummy gate is partially overlapped by the first and second selected ones of the second poly gates.

10. The HCCD according to claim 8, wherein the dummy gate is connected to ground.

11. The HCCD according to claim 7, further comprising a dummy drain on the BCCD channel.

12. The HCCD according to claim 11, wherein the dummy drain is connected to a voltage source.

13. The HCCD according to claim 10, wherein the dummy drain comprises an $n^-$-type layer.

* * * * *